(12) United States Patent
Na et al.

(10) Patent No.: US 10,890,846 B2
(45) Date of Patent: Jan. 12, 2021

(54) PHOTOSENSITIVE RESIN COMPOSITION AND CURED FILM PREPARED THEREFROM

(71) Applicant: Rohm and Haas Electronic Materials Korea Ltd., Cheonan (KR)

(72) Inventors: Jong-Ho Na, Hwaseong (KR); Geun Huh, Hwaseong (KR); Jin Kwon, Hwaseong (KR); Jong Han Yang, Hwaseong (KR)

(73) Assignee: Rohm and Haas Electronic Materials Korea Ltd, Seoul (KR)

( * ) Notice: Subject to any disclaimer, the term of this patent is extended or adjusted under 35 U.S.C. 154(b) by 172 days.

(21) Appl. No.: 15/769,945

(22) PCT Filed: Sep. 22, 2016

(86) PCT No.: PCT/KR2016/010551
§ 371 (c)(1),
(2) Date: Apr. 20, 2018

(87) PCT Pub. No.: WO2017/078267
PCT Pub. Date: May 11, 2017

(65) Prior Publication Data
US 2018/0314153 A1 Nov. 1, 2018

(30) Foreign Application Priority Data
Nov. 6, 2015 (KR) .......................... 10-2015-0155970

(51) Int. Cl.
| | | |
|---|---|---|
| *G03F 7/075* | (2006.01) | |
| *G03F 7/004* | (2006.01) | |
| *G03F 7/022* | (2006.01) | |
| *G03F 7/023* | (2006.01) | |
| *G03F 7/16* | (2006.01) | |
| *G03F 7/20* | (2006.01) | |
| *G03F 7/32* | (2006.01) | |
| *G03F 7/40* | (2006.01) | |
| *G03F 7/038* | (2006.01) | |
| *G03F 7/039* | (2006.01) | |
| *H01L 21/3105* | (2006.01) | |
| *H01L 27/12* | (2006.01) | |
| *H01L 27/32* | (2006.01) | |
| *C08G 77/18* | (2006.01) | |
| *C08G 77/24* | (2006.01) | |

(52) U.S. Cl.
CPC .......... *G03F 7/0757* (2013.01); *G03F 7/0046* (2013.01); *G03F 7/0226* (2013.01); *G03F 7/0233* (2013.01); *G03F 7/168* (2013.01); *G03F 7/2002* (2013.01); *G03F 7/322* (2013.01); *G03F 7/40* (2013.01); *H01L 21/31056* (2013.01); *H01L 27/1248* (2013.01); *H01L 27/1288* (2013.01); *H01L 27/3258* (2013.01); *C08G 77/18* (2013.01); *C08G 77/24* (2013.01); *G03F 7/038* (2013.01); *G03F 7/039* (2013.01); *G03F 7/162* (2013.01)

(58) Field of Classification Search
CPC .................................................... G03F 7/0757
See application file for complete search history.

(56) References Cited

U.S. PATENT DOCUMENTS

| | | | |
|---|---|---|---|
| 5,389,497 A | 2/1995 | Yoshioka et al. | |
| 7,374,856 B2 | 5/2008 | Suwa et al. | |
| 8,883,397 B2 | 11/2014 | Yokoyama et al. | |
| 2002/0135654 A1* | 9/2002 | Ishikawa | B41M 7/00 347/106 |
| 2003/0193624 A1 | 10/2003 | Kobayashi et al. | |
| 2009/0105360 A1 | 4/2009 | Niwa et al. | |
| 2014/0335452 A1 | 11/2014 | Yokoyama et al. | |
| 2018/0030189 A1* | 2/2018 | Knapp | G03F 7/0755 |
| 2018/0307141 A1* | 10/2018 | Kwon | G03F 7/0226 |

FOREIGN PATENT DOCUMENTS

| | | |
|---|---|---|
| EP | 0318956 A2 | 6/1989 |
| TW | 201525621 A | 7/2015 |
| WO | 2011136073 A1 | 11/2011 |

OTHER PUBLICATIONS

Search Report for Taiwan Patent Application No. 105134456; Application dated Oct. 25, 2016.

\* cited by examiner

*Primary Examiner* — Cynthia Hamilton
(74) *Attorney, Agent, or Firm* — S. Matthew Cairns

(57) ABSTRACT

Disclosed herein are a photosensitive resin composition and a cured film prepared therefrom. The photosensitive resin composition introduces a siloxane polymer containing a fluorine atom which has strong water-repellency into a composition including a common siloxane polymer and an epoxy compound, and fluorine groups may be present in the whole region of the cured film so that the water-repellency due to a fluorine component may be maintained even after removing the surface of the cured film is removed via a dry etching process. As a result, the resistance (chemical resistance) to chemicals used in a post-processing can be maximizes to provide a cured film having excellent stability.

8 Claims, No Drawings

PHOTOSENSITIVE RESIN COMPOSITION AND CURED FILM PREPARED THEREFROM

TECHNICAL FIELD

The present invention relates to a photosensitive resin composition and a cured film prepared therefrom. In particular, the present invention relates to a positive-type photosensitive resin composition, from which a cured film that has high transparency and excellent chemical resistance is formed, and a cured film which is prepared from the composition and used in a liquid crystal display (LCD) or an organic light-emitting diode (OLED).

BACKGROUND ART

Generally, a transparent planarized film is formed on a thin film transistor (TFT) substrate for the purpose of insulating to prevent a contact between a transparent electrode and a data line in an LCD or an OLED. Through a transparent pixel electrode positioned near the data line, the aperture ratio of a panel may be increased and high brightness/resolution may be attained. In order to form such a transparent planarized film, several processing steps are employed to impart a specific pattern profile, and a positive-type photosensitive resin composition is widely employed in this process since fewer processing steps are required. Particularly, a positive-type photosensitive resin composition containing a siloxane polymer is known as a material having high heat resistance, high transparency, and low dielectric constant.

A siloxane composition responsible for high heat resistance, high transparency and high resolution is known in the art. The conventional siloxane composition may be obtained by adding a 1,2-quinonediazide compound into a siloxane polymer in which a T-type siloxane structural unit having a phenyl residue and a Q-type siloxane structural unit are combined each other. For example, Korean Laid-open Patent Publication No. 2006-59202 discloses a composition including a siloxane polymer containing a phenolic hydroxyl group in an amount of 20 mole % or less, a quinonediazide compound (0.1 to 10 wt %) that contains no methyl group in the ortho- or para-position relative to the phenolic hydroxyl group therein, and a compound containing an alcoholic hydroxyl group and/or a cyclic compound containing a carbonyl group as a solvent. It also discloses a cured film prepared from the composition, which has at least 95% transmittance and satisfies specific chromaticity coordinate.

Meanwhile, a planarized film prepared using a conventional positive-type photosensitive composition containing such siloxane composition or a display device employing same may have problems such as swelling or delamination of the film from a substrate when the cured film is immersed in, or comes into contact with, a solvent, an acid, an alkali, and the like, which are used in a post-processing. Further, in line with the increasing demand on the high precision/resolution and in order to decrease a processing time, the concentration of a solvent, an acid, an alkali, and the like used in a post-processing becomes higher than before. In addition, the surface of a cured film is removed via a dry etching process, and thus the solvent, the acid, the alkali, and the like may more easily penetrate via the removed surface. Accordingly, the demand on a photosensitive resin composition, which may form a cured film having good chemical resistance during a post-processing, is increasing.

DISCLOSURE OF INVENTION

Technical Problem

Accordingly, it is an object of the present invention to provide a photosensitive resin composition which may form a highly transparent cured film having good chemical resistance to chemical materials (solvent, acid, alkali, and the like) used in a post-processing, and a cured film prepared therefrom used in an LCD, OLED and the like.

Solution to Problem

In accordance with one aspect of the present invention, there is provided a photosensitive resin composition, which includes:

(A) a siloxane polymer containing a fluorine atom;
(B) a 1,2-quinonediazide compound; and
(C) an epoxy compound.

Advantageous Effects of Invention

The photosensitive resin composition of the present invention comprises a siloxane polymer containing a fluorine atom which has strong water-repellency and an epoxy compound. The epoxy compound relatively reduces the number of highly reactive silanol groups in the siloxane polymer, thereby improving chemical resistance. At the same time, fluorine groups can be present not only on the surface but in the whole region of an organic film (cured film), so that the water-repellency due to a fluorine component may be maintained even after the surface of the cured film is removed via a dry etching process. As a result, the resistance (chemical resistance) to chemicals used in a post-processing can be maximized to provide a cured film having excellent stability.

BEST MODE FOR CARRYING OUT THE INVENTION

The photosensitive resin composition according to the present invention includes (A) a siloxane polymer containing a fluorine atom, (B) a 1,2-quinonediazide compound, and (C) an epoxy compound, and may optionally further include (D) a solvent, (E) a surfactant, and/or (F) an adhesion assisting agent.

Hereinafter, each component of the photosensitive resin composition will be explained in detail.

In the present disclosure, "(meth)acryl" means "acryl" and/or "methacryl," and "(meth)acrylate" means "acrylate" and/or "methacrylate."

(A) Siloxane Polymer Containing Fluorine Atom

The siloxane polymer includes a condensate of a silane compound containing a fluorine atom and/or a hydrolysate thereof. The siloxane polymer is not specifically limited as long as it contains a fluorine atom. The fluorine atom may be combined with a silicon atom of the siloxane polymer or may be included as an atom constituting an organic group combined with a silicon atom. The organic group may include, for example, a substituted or unsubstituted fluorinated hydrocarbon group.

The fluorinated hydrocarbon group may include, for example, a fluorinated alkyl such as fluoromethyl, fluoroethyl, difluoroethyl, trifluoromethyl, trifluoroethyl, and pentafluoroethyl; a fluorinated aliphatic hydrocarbon such as fluorocyclopentyl, difluorocyclopentyl, tetrafluorocyclopentyl, nonafluorocyclopentyl, tetrafluorocyclohexyl, undecafluorocyclohexyl, fluoronorbornyl, difluoronorbornyl, fluoroadamantyl, and difluoroadamantyl; a fluorinated phenyl such as fluorophenyl, difluorophenyl, trifluorophenyl, tetrafluorophenyl, and pentafluorophenyl; a fluorinated aryl such as fluorotolyl, pentafluorotolyl, trifluoromethylphenyl, and trifluoromethylfluorophenyl; and a fluorinated aralkyl such as fluorobenzyl, difluorobenzyl, trifluorobenzyl, tetrafluorobenzyl, pentafluorobenzyl, fluorophenylethyl, and pentafluorophenylethyl.

Among the groups, the fluorinated alkyl is preferable, and the trifluoromethyl, the trifluoroethyl, and the pentafluoroethyl are more preferable.

A substituent that may be substituted for the fluorinated hydrocarbon may include, for example, a halogen atom such as a chlorine atom, a bromine atom, and an iodine atom, a hydroxyl group, an alkoxy group, an alkoxycarbonyl group, an alkoxycarbonyloxy group, an acyl group, an acyloxy group, a cyano group and the like.

The siloxane polymer containing a fluorine atom(A) may include at least one structural unit derived from a silane compound represented by the following formula 1:

[Formula 1]

In formula 1, $R^1$ is a fluorine atom or a monovalent hydrocarbon containing a fluorine atom, wherein, in case where $R^1$ is the monovalent hydrocarbon, hydrogen atoms may be partially or wholly substituted, and in case where a plurality of $R^1$ is present in the same molecule, each $R^1$ may be identical to or different from one another;

$R^2$ is hydrogen, alkyl having 1 to 6 carbon atoms, acyl having 2 to 6 carbon atoms, or aryl having 6 to 15 carbon atoms, wherein, in case where a plurality of $R^2$ is present in the same molecule, each $R^2$ may be identical to or different from one another, and in case where $R^2$ is alkyl, acyl or aryl, hydrogen atoms may be partially or wholly substituted; and n is an integer from 1 to 3.

Specific examples of the silane compound may include fluorotrimethoxysilane, fluorotriethoxysilane, trifluoromethyltrimethoxysilane, trifluoromethyltriethoxysilane, trifluoropropyltrimethoxysilane, trifluoropropyltriethoxysilane, fluoromethyldimethoxysilane, fluoromethyldiethoxysilane, trifluoromethyldimethoxysilane, trifluoromethyldiethoxysilane, trifluoropropylmethyldimethoxysilane, trifluoropropylmethyldiethoxysilane, fluorophenyltrimethoxysilane, fluorophenyltriethoxysilane, trifluoroethyltrimethoxysilane, trifluoroethyltriethoxysilane, pentafluoroethyltrimethoxysilane, pentafluoroethyltriethoxysilane, and the like. The compounds may be used alone or in combination of two or more.

Among the compounds, the silane compound containing the fluorinated alkyl is preferable. Specifically, the trifluoromethyltrimethoxysilane, trifluoromethyltriethoxysilane, trifluoroethyltrimethoxysilane, trifluoroethyltriethoxysilane, pentafluoroethyltrimethoxysilane, or pentafluoroethyltriethoxysilane is more preferable, and the trifluoromethyltrimethoxysilane, or trifluoromethyltriethoxysilane is particularly preferable.

The siloxane polymer containing a fluorine atom(A) may further include at least one structural unit derived from a silane compound represented by the following formula 2:

[Formula 2]

In formula 2, $R^3$ is alkyl having 1 to 12 carbon atoms, alkenyl having 2 to 10 carbon atoms, or aryl having 6 to 15 carbon atoms, wherein, in case where a plurality of $R^3$ is present in the same molecule, each $R^3$ may be identical to or different from one another, and in case where $R^3$ is alkyl, alkenyl or aryl, hydrogen atoms may be partially or wholly substituted, and $R^3$ may include a structural unit containing a heteroatom;

$R^4$ is hydrogen, alkyl having 1 to 6 carbon atoms, acyl having 2 to 6 carbon atoms, or aryl having 6 to 15 carbon atoms, wherein, in case where a plurality of $R^4$ is present in the same molecule, each $R^4$ may be identical to or different from one another, and in case where $R^4$ is alkyl, acyl or aryl, hydrogen atoms may be partially or wholly substituted; and n is an integer from 0 to 3.

Examples of $R^3$ including a structural unit containing a heteroatom may include ether, ester and sulfide.

The silane compound may be a tetrafunctional silane compound where n is 0, a trifunctional silane compound where n is 1, a difunctional silane compound where n is 2, and a monofunctional silane compound where n is 3.

Particularly, the siloxane polymer containing a fluorine atom may include a structural unit derived from the silane compound of formula 2 where n is 0.

Particular examples of the silane compound represented by formula 2 may include, for example, as the tetrafunctional silane compound, tetraacetoxysilane, tetramethoxysilane, tetraethoxysilane, tetrabutoxysilane, tetraphenoxysilane, tetrabenzyloxysilane, and tetrapropoxysilane; as the trifuntional silane compound, methyltrimethoxysilane, methyltriethoxysilane, methyltriisopropoxysilane, methyltributoxysilane, ethyltrimethoxysilane, ethyltriethoxysilane, ethyltriisopropoxysilane, ethyltributoxysilane, butyltrimethoxysilane, phenyltrimethoxysilane, phenyltriethoxysilane, d³-methyltrimethoxysilane, n-propyltrimethoxysilane, n-propyltriethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, 3-acryloxypropyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, [(3-ethyl-3-oxetanyl)methoxy]propyltrimethoxysilane, [(3-ethyl-3-oxetanyl)methoxy]propyltriethoxysilane, 3-mercaptopropyltrimethoxysilane, and 3-trimethoxysilylpropylsuccinic acid; as difunctional silane compound, dimethyldiacetoxysilane, dimethyldimethoxysilane, diphenyldimethoxysilane, diphenyldiethoxysilane, diphenyldiphenoxysilane, dibutyldimethoxysilane, dimethyldiethoxysilane, (3-glycidoxypropyl)methyldimethoxysilane, (3-glycidoxypropyl)methyldiethoxysilane, 3-(2-aminoethylamino)propyldimethoxymethylsilane, 3-aminopropyldiethoxymethylsilane, 3-chloropropyldimethoxymethylsilane, 3-mercaptopropyldimethoxymethylsilane, cyclohexyldimethoxymethylsilane, diethoxymethylvinylsilane, dimethoxymethylvinylsilane, and dimethoxydi-p-tolylsilane; and as the monofunctional silane compound, trimethylsilane, tributylsilane, trimethylmethoxysilane, tributylethoxysilane, (3-glycidoxypropyl)dimethylmethoxysilane, and (3-glycidoxypropyl)dimethylethoxysilane.

Preferred among the tetrafunctional silane compounds are tetramethoxysilane, tetraethoxysilane, and tetrabutoxysilane; preferred among the trifunctional silane compounds are methyltrimethoxysilane, methyltriethoxysilane, methyltriisopropoxysilane, methyltributoxysilane, phenyltrimethoxysilane, ethyltrimethoxysilane, ethyltriethoxysilane, ethyltriisopropoxysilane, ethyltributoxysilane, and butyltrimethoxysilane; preferred among the difunctional silane compounds are dimethyldimethoxysilane, diphenyldimethoxysilane, diphenyldiethoxysilane, diphenyldiphenoxysilane, dibutyldimethoxysilane, and dimethyldiethoxysilane.

These silane compounds may be used alone or in combination of two or more thereof.

The siloxane polymer containing a fluorine atom(A) may be a condensate of the silane compound of formula 1 or a hydrolysate thereof and the silane compound of formula 2 or a hydrolysate thereof.

The conditions for preparing the hydrolysate of the silane compound represented by formula 1 or 2 or the condensate thereof are not specifically limited. For example, the desired hydrolysate or the condensate thereof may be prepared by diluting the silane compound of formula 1 or 2 in a solvent such as ethanol, 2-propanol, acetone, and butyl acetate; adding thereto water necessary for the reaction, and, as a catalyst, an acid (e.g., hydrochloric acid, acetic acid, nitric acid, and the like) or a base (e.g., ammonia, triethylamine, cyclohexylamine, tetramethylammonium hydroxide, and the like); and then stirring the mixture thus obtained to complete the hydrolytic polymerization reaction.

The weight average molecular weight of the siloxane polymer containing a fluorine atom is preferably in the range of 500 to 50,000. Within this range, the photosensitive resin composition may have desirable film forming properties, solubility, and dissolution rates in a developer.

The kinds of the solvent and the acid or base catalyst used in the preparation and the amounts thereof may be optionally selected without specific limitation. The hydrolytic polymerization may be carried out at a low temperature of 20° C. or less, but the reaction may also be promoted by heating or refluxing. The time required for the reaction may vary depending on various conditions including the kind or concentration of the silane monomer, reaction temperature, etc. Generally, the reaction time required for obtaining a condensate having the weight average molecular weight of about 500 to 50,000 is in the range of 15 minutes to 30 days; however, the reaction time is not limited thereto.

The fluorine atom content in the siloxane polymer containing a fluorine atom may be 1 to 30%, 1 to 20%, or 2 to 20% of the content(mole %) of the fluorine-containing structural unit in the siloxane polymer based on an Si atomic mole number. Within the range, the cured film thus manufactured may include a fluorine component which has strong water-repellency over the whole cured film including the surface thereof, and the water-repellency may be maintained even after removing the surface of the cured film through chemical processes such as dry etching, thereby maximizing chemical resistance. However, if the fluorine atom content is deviated from the range, excessive amount of the fluorine components may combine with each other to rather weaken chemical resistance.

The siloxane polymer (A) may include a linear siloxane structural unit (i.e., D-type siloxane structural unit). The linear siloxane structural unit may be derived from a difunctional silane compound, for example, a silane compound represented by formula 2 where n is 2. Specifically, the siloxane polymer (A) includes the structural unit derived from the silane compound of formula 2 where n is 2 in an amount of 0.5 to 50 mole %, and preferably 1 to 30 mole % based on an Si atomic mole number. Within this range, a cured film may maintain a constant hardness, and exhibit flexible properties, thereby further improving crack resistance to external stress.

Further, the siloxane polymer (A) may include a structural unit derived from a silane compound represented by formula 2 where n is 1 (i.e., T-type structural unit). Preferably, the siloxane polymer (A) includes the structural unit derived from the silane compound represented by formula 2 where n is 1, in an amount of 40 to 85 mole %, more preferably 50 to 80 mole % based on an Si atomic mole number. Within this range, the photosensitive resin composition may form a cured film with a more precise pattern profile.

In addition, in consideration of the hardness, sensitivity, and retention rate of a cured film, it is preferable that the siloxane polymer (A) includes a structural unit derived from a silane compound having an aryl group. For example, the siloxane polymer (A) may include a structural unit derived from a silane compound having an aryl group in an amount of 30 to 70 mole %, and preferably 35 to 50 mole % based on an Si atomic mole number. Within this range, the compatibility of a siloxane polymer and a 1,2-naphthoquinonediazide compound is good, and thus, the excessive decrease in sensitivity may be prevented while attaining more favorable transparency of a cured film. The structural unit derived from the silane compound having an aryl group may be a structural unit derived from a silane compound of formula 2 where $R^3$ is an aryl group, particularly, derived from a silane compound of formula 2 where n is 1 and $R^3$ is an aryl group, more particularly, derived from a silane compound of formula 2 where n is 1 and $R^3$ is phenyl (i.e., T-phenyl type structural unit).

The siloxane polymer (A) may include a structural unit derived from a silane compound represented by formula 2 where n is 0 (i.e., Q-type structural unit). Preferably, the siloxane polymer (A) includes the structural unit derived from the silane compound represented by formula 2 where n is 0, in an amount of 10 to 40 mole %, and preferably 15 to 35 mole % based on an Si atomic mole number. Within this range, the photosensitive resin composition may maintain its solubility in an aqueous alkaline solution at a proper degree during forming a pattern, thereby preventing any defects caused by a reduction in the solubility or a drastic increase in the solubility of the composition.

The term "mole % based on the Si atomic mole number" as used herein refers to the percentage of the number of moles of Si atoms contained in a certain structural unit with respect to the total number of moles of Si atoms contained in all the structural units constituting the siloxane polymer.

The mole amount of the siloxane unit in the siloxane polymer (A) may be measured by the combination of Si-NMR, $^1$-NMR, $^{13}$C-NMR, IR, TOF-MS, elementary analysis, determination of ash, and the like. For example, in order to measure the mole amount of a siloxane unit having a phenyl group, an Si-NMR analysis is performed on a total siloxane polymer, a phenyl-bound Si peak area and a phenyl-unbound Si peak area are then analyzed, and the mole amount can thus be computed from the peak area ratio therebetween.

The photosensitive resin composition of the present invention may include the siloxane polymer (A) containing a fluorine atom in an amount of 50 to 95 wt %, and preferably 65 to 90 wt %, based on the total weight of the solid content of the composition excluding solvents. Within this amount range, the resin composition can maintain its developability at a suitable level, thereby producing a cured film with improved film retention rates and pattern resolution.

(B) 1,2-Quinonediazide Compound

The photosensitive resin composition according to the present invention includes a 1,2-quinonediazide compound (B).

The 1,2-quinonediazide compound may be any compound used as a photosensitive agent in the photoresist field.

Examples of the 1,2-quinonediazide compound include an ester of a phenolic compound and 1,2-benzoquinonediazide-4-sulfonic acid or 1,2-benzoquinonediazide-5-sulfonic acid; an ester of a phenolic compound and 1,2-naphthoquinonediazide-4-sulfonic acid or 1,2-naphthoquinonediazide-5-sulfonic acid; a sulfonamide of a phenolic compound in which a hydroxyl group is substituted with an amino group and 1,2-benzoquinonediazide-4-sulfonic acid or 1,2-benzoquinonediazide-5-sulfonic acid; and a sulfonamide of a phenolic compound in which a hydroxyl group is substituted with an amino group and 1,2-naphthoquinonediazide-4-sulfonic acid or 1,2-naphthoquinonediazide-5-sulfonic acid. The above compounds may be used alone or in combination of two or more compounds.

Examples of the phenolic compound include 2,3,4-trihydroxybenzophenone, 2,4,6-trihydroxybenzophenone, 2,2',4,4'-tetrahydroxybenzophenone, 2,3,3',4-tetrahydroxybenzophenone, 2,3,4,4'-tetrahydroxybenzophenone, bis(2,4-dihydroxyphenyl)methane, bis(p-hydroxyphenyl)methane, tri(p-hydroxyphenyl)methane, 1,1,1-tri(p-hydroxyphenyl)ethane, bis(2,3,4-trihydroxyphenyl)methane, 2,2-bis(2,3,4-trihydroxyphenyl)propane, 1,1,3-tris(2,5-dimethyl-4-hydroxyphenyl)-3-phenylpropane, 4,4'-[1-[4-[1-[4-hydroxyphenyl]-1-methylethyl]phenyl]ethylidene]bisphenol, bis(2,5-dimethyl-4-hydroxyphenyl)-2-hydroxyphenylmethane, 3,3,3',3'-tetramethyl-1,1'-spirobiindene-5,6,7,5',6',7'-hexanol, and 2,2,4-trimethyl-7,2',4'-trihydroxyflavane.

More particular examples of the 1,2-quinonediazide compound include an ester of 2,3,4-trihydroxybenzophenone and 1,2-naphthoquinonediazide-4-sulfonic acid, an ester of 2,3,4-trihydroxybenzophenone and 1,2-naphthoquinonediazide-5-sulfonic acid, an ester of 4,4'-[1-[4-[1-[4-hydroxyphenyl]-1-methylethyl]phenyl] ethylidene]bisphenol and 1,2-naphthoquinonediazide-4-sulfonic acid, and an ester of 4,4'-[1-[4-[1-[4-hydroxyphenyl]-1-methylethyl]phenyl]ethylidene]bisphenol and 1,2-naphthoquinonediazide-5-sulfonic acid.

The above compounds may be used alone or in combination of two or more compounds.

By using the aforementioned preferable compounds, the transparency of the positive-type photosensitive resin composition may be improved.

The 1,2-quinonediazide compound (B) may be included in the photosensitive resin composition in an amount ranging from 1 to 50 parts by weight, preferably 2 to 25 parts by weight, and more preferably 3 to 15 parts by weight based on 100 parts by weight of the siloxane polymer (A) on the basis of the solid content excluding solvents. When the 1,2-quinonediazide compound is used in the above amount range, the resin composition may more readily form a pattern, while inhibiting the generation of defects such as a rough surface of a coated film and scum at the bottom portion of the pattern upon development.

(C) Epoxy Compound

In the photosensitive resin composition of the present invention, an epoxy compound is employed together with the siloxane polymer so as to increase the internal density of a siloxane binder, to thereby improve the chemical resistance of a cured film prepared therefrom.

The epoxy compound may be a homo oligomer or a hetero oligomer of an unsaturated monomer including at least one epoxy group.

Examples of the unsaturated monomer including at least one epoxy group may include glycidyl (meth)acrylate, 4-hydroxybutylacrylate glycidyl ether, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth)acrylate, 3,4-epoxycyclohexyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-(2,3-epoxypropoxy)-3,5-dimethylphenylpropyl)acrylamide, allyl glycidyl ether, 2-methylallyl glycidyl ether, o-vinylbenzyl glycidyl ether, m-vinylbenzyl glycidyl ether, p-vinylbenzyl glycidyl ether, or a mixture thereof. Preferably, glycidyl methacrylate may be used.

The epoxy compound may be synthesized by any conventional methods known in the art.

An example of the commercially available epoxy compound may include GHP03 (glycidyl methacrylate homopolymer, Miwon Commercial Co., Ltd.).

The epoxy compound (C) may further include the following structural units.

Representative examples may include any structural unit derived from styrene; a styrene having an alkyl substituent such as methylstyrene, dimethylstyrene, trimethylstyrene, ethylstyrene, diethylstyrene, triethylstyrene, propylstyrene, butylstyrene, hexylstyrene, heptylstyrene, and octylstyrene; a styrene having a halogen such as fluorostyrene, chlorostyrene, bromostyrene, and iodostyrene; a styrene having an alkoxy substituent such as methoxystyrene, ethoxystyrene, and propoxystyrene; p-hydroxy-a-methylstyrene, acetylstyrene; an ethylenically unsaturated compound having an aromatic ring such as divinylbenzene, vinylphenol, o-vinylbenzyl methyl ether, m-vinylbenzyl methyl ether, and p-vinylbenzyl methyl ether; an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth)acrylate, 3-methoxybutyl (meth)acrylate, ethoxy diethylene glycol (meth)acrylate, methoxy triethylene glycol (meth)acrylate, methoxy tripropylene glycol (meth)acrylate, poly(ethylene glycol) methyl ether (meth)acrylate, phenyl (meth)acrylate, benzyl (meth)acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, tribromophenyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; a tertiary amine having an N-vinyl group such as N-vinyl pyrrolidone, N-vinyl carbazole, and N-vinyl morpholine; an unsaturated ether such as vinyl methyl ether, and vinyl ethyl ether; an unsaturated imide such as N-phenylmaleimide, N-(4-chlorophenyl)maleimide, N-(4-hydroxyphenyl)maleimide, and N-cyclohexylmaleimide. The structural unit derived from the above exemplary compounds may be contained in the epoxy compound (C) alone or in combination of two or more thereof.

For polymerizability of the composition, styrene-based compounds are preferred among these examples.

Particularly, in terms of chemical resistance, it is more preferable that the epoxy compound (C) does not contain a carboxyl group, by not using a structural unit derived from monomers containing a carboxyl group among these compounds.

The structural unit may be used in an amount of 0 to 70 mole %, and preferably 10 to 60 mole % based on the total number of moles of the structural units constituting the epoxy compound (C). Within this range, a cured film may have desirable hardness.

The weight average molecular weight of the epoxy compound (C) may be in the range of 100 to 30,000, and preferably 1,000 to 15,000. If the weight average molecular weight of the epoxy compound is at least 100, a cured film may have improved hardness. Also, if the weight average molecular weight of the epoxy compound is 30,000 or less, a cured film may have a uniform thickness, which is suitable for planarizing any steps thereon. The weight average molecular weight is determined by gel permeation chromatography (GPC, eluent: tetrahydrofuran) using polystyrene standards.

In the photosensitive resin composition of the present invention, the epoxy compound (C) may be included in the photosensitive resin composition in an amount of 0.5 to 50 parts by weight, preferably 1 to 30 parts by weight, and more preferably 5 to 25 parts by weight based on 100 parts by weight of the siloxane polymer (A) on the basis of the solid content excluding solvents. Within the amount range, the chemical resistance and sensitivity of the photosensitive resin composition may be improved. If the amount range is deviated from the range, chemical resistance may be largely deteriorated with a small amount used, and sensitivity may be largely deteriorated with an excessive amount used.

(D) Solvent

The photosensitive resin composition of the present invention may be prepared as a liquid composition in which the above components are mixed with a solvent. The solvent may be, for example, an organic solvent.

The amount of the solvent in the photosensitive resin composition according to the present invention is not specifically limited. For example, the photosensitive resin composition may contain the solvent in an amount such that its solid content ranges from 5 to 80 wt %, preferably 10 to 70 wt %, and more preferably 15 to 60 wt % based on the total weight of the photosensitive resin composition. The solid content refers to all the components included in the resin composition of the present invention excluding solvents. Within the amount range, coatability may be favorable, and an appropriate degree of flowability may be maintained.

The solvent of the present invention is not specifically limited as long as being capable of dissolving each component of the composition and being chemically stable. Examples of the solvent may include alcohol, ether, glycol ether, ethylene glycol alkyl ether acetate, diethylene glycol, propylene glycol monoalkyl ether, propylene glycol alkyl ether acetate, propylene glycol alkyl ether propionate, aromatic hydrocarbon, ketone, ester and the like.

Particular examples of the solvent include methanol, ethanol, tetrahydrofuran, dioxane, methyl cellosolve acetate, ethyl cellosolve acetate, ethyl acetoacetate, ethylene glycol monomethyl ether, ethylene glycol monoethyl ether, ethylene glycol dimethyl ether, ethylene glycol diethyl ether, propylene glycol dimethyl ether, propylene glycol diethyl ether, diethylene glycol monomethyl ether, diethylene glycol monoethyl ether, diethylene glycol dimethyl ether, diethylene glycol ethyl methyl ether, propylene glycol monomethyl ether, propylene glycol monoethyl ether, propylene glycol monopropyl ether, dipropylene glycol dimethyl ether, dipropylene glycol diethyl ether, propylene glycol methyl ether acetate, propylene glycol ethyl ether acetate, propylene glycol propyl ether acetate, dipropylene glycol methyl ether acetate, propylene glycol butyl ether acetate, toluene, xylene, methyl ethyl ketone, 4-hydroxy-4-methyl-2-pentanone, cyclopentanone, cyclohexanone, 2-heptanone, γ-butyrolactone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 2-methoxypropionate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, N-methylpyrrolidone, and the like.

Preferred among these exemplary solvents are ethylene glycol alkyl ether acetate, diethylene glycol, propylene glycol mono alkyl ether, propylene glycol alkyl ether acetate, and ketone. Particularly, diethylene glycol dimethyl ether, diethylene glycol ethyl methyl ether, dipropylene glycol dimethyl ether, dipropylene glycol diethyl ether, propylene glycol monomethyl ether, propylene glycol monoethyl ether, propylene glycol methyl ether acetate, methyl 2-methoxypropionate, γ-butyrolactone, and 4-hydroxy-4-methyl-2-pentanone are preferred.

The above compounds may be used alone or in combination of two or more thereof.

(E) Surfactant

The photosensitive resin composition of the present invention may further include a surfactant to enhance its coatability.

The kind of the surfactant is not limited, but preferred are fluorine-based surfactants, silicon-based surfactants, non-ionic surfactants and the like.

Specific examples of the surfactants may include fluorine- and silicon-based surfactants such as FZ-2122 manufactured by Dow Corning Toray Silicon Co., Ltd., BM-1000, and BM-1100 manufactured by BM CHEMIE Co., Ltd., Megapack F-142 D, Megapack F-172, Megapack F-173, and Megapack F-183 manufactured by Dai Nippon Ink Kagaku Kogyo Co., Ltd., Florad FC-135, Florad FC-170 C, Florad FC-430, and Florad FC-431 manufactured by Sumitomo 3M Ltd., Sufron S-112, Sufron S-113, Sufron S-131, Sufron S-141, Sufron S-145, Sufron S-382, Sufron SC-101, Sufron SC-102, Sufron SC-103, Sufron SC-104, Sufron SC-105, and Sufron SC-106 manufactured by Asahi Glass Co., Ltd., Eftop EF301, Eftop EF303, and Eftop EF352 manufactured by Shinakida Kasei Co., Ltd., SH-28 PA, SH-190, SH-193, SZ-6032, SF-8428, DC-57, and DC-190 manufactured by Toray Silicon Co., Ltd.; non-ionic surfactants such as polyoxyethylene alkyl ethers including polyoxyethylene lauryl ether, polyoxyethylene stearyl ether, polyoxyethylene oleyl ether, and the like, polyoxyethylene aryl ethers including polyoxyethylene octylphenyl ether, polyoxyethylene nonylphenyl ether, and the like, and polyoxyethylene dialkyl esters including polyoxyethylene dilaurate, polyoxyethylene distearate, and the like; and organosiloxane polymer KP341 (manufactured by Shin-Etsu Chemical Co., Ltd.), (meth) acrylate-based copolymer Polyflow No. 57 and 95 (Kyoe-isha Yuji Chemical Co., Ltd.), and the like. They may be used alone or in combination of two or more thereof.

The surfactant (E) may be contained in the photosensitive resin composition in an amount of 0.001 to 5 parts by weight, preferably 0.05 to 3 parts by weight, and more preferably 0.2 to 2 parts by weight based on 100 parts by weight of the siloxane polymer (A) on the basis of the solid content excluding solvents. Within the amount range, the coatability and leveling property of the composition may be good.

The photosensitive resin composition of the present invention may be used as a positive-type photosensitive resin composition.

Particularly, since the photosensitive resin composition of the present invention introduces a siloxane polymer containing a fluorine atom which has strong water-repellency, into a composition including a common siloxane polymer and an epoxy compound, the epoxy compound relatively reduces the number of highly reactive silanol groups in the siloxane polymer, thereby improving chemical resistance. At the same time, fluorine groups can be present not only on the surface but in the whole region of the organic film (cured film), so that the water-repellency due to a fluorine component may be maintained even after the surface of the cured film is removed via a dry etching process. As a result, the resistance (chemical resistance) to chemicals used in a post-processing can be maximized to provide a cured film having excellent stability.

Further, the present invention provides a cured film prepared from the photosensitive resin composition.

The cured film may be prepared by a method known in the art, for instance, by coating the photosensitive resin composition on a substrate and subjecting the resultant composition to a curing process.

The coating process may be carried out by means of a spin coating method, a slit coating method, a roll coating method, a screen printing method, an applicator method, and the like, to a desired thickness of, e.g., 2 to 25 μm.

For the curing of the photosensitive resin composition, for example, the composition coated on a substrate may be subjected to pre-bake at a temperature of, for example, 60 to 130° C. to remove solvents; then exposed to light using a photomask having a desired pattern; and subjected to development using a developer, for example, a tetramethylammonium hydroxide (TMAH) solution, to form a pattern on the coated film. The light exposure may be carried out at an exposure rate of 10 to 200 mJ/cm$^2$ based on a wavelength of 365 nm in a wavelength band of 200 to 500 nm. As a light source used for the exposure (irradiation), a low pressure mercury lamp, a high pressure mercury lamp, an extra high pressure mercury lamp, a metal halide lamp, an argon gas laser, etc., may be used; and X-ray, electronic ray, etc., may also be used, if desired.

Then, the coated film with a pattern is subjected to post-bake, if necessary, for instance, at a temperature of 150 to 300° C. for 10 minutes to 5 hours to prepare a desired cured film.

In addition, the present invention provides a method of forming a pattern, including forming a silicon-containing film on the surface of a substrate using the photosensitive resin composition; patterning the silicon-containing film using light; and dry etching the patterned silicon-containing film and the substrate to form a pattern on the substrate.

Specifically, a patterned silicon-containing film may be formed through processes including coating the photosensitive resin composition on the surface of a substrate, exposing, and developing. Through dry etching the patterned silicon-containing film and the substrate, a pattern may be formed on the substrate.

The silicon-containing cured film formed by the method may have a contact angle of 80° or more after dry etching.

The cured film thus patterned has excellent physical properties in terms of heat resistance, transparency, dielectric constant, solvent resistance, acid resistance, and alkali resistance.

The cured film thus patterned has excellent light transmittance without surface roughness when the composition is subjected to heat treatment or is immersed in, or comes into contact with a solvent, an acid, an alkali, etc. Thus, the cured film can be used effectively as a planarized film for a TFT substrate of an LCD or an OLED; a partition of an OLED; an interlayer dielectric of a semiconductor device; a core or cladding material of an optical waveguide, etc.

Furthermore, the present invention provides electronic parts including the patterned cured film as a protective film.

MODE FOR THE INVENTION

Hereinafter, the present invention will be described in more detail with reference to the following Examples. However, these examples are only provided to illustrate the present invention, and the scope of the present invention is not limited thereto.

In the following examples, the weight average molecular weight is determined by gel permeation chromatography (GPC) using a polystyrene standard.

Synthetic Example 1: Synthesis of Siloxane Polymer (a)

To a reactor equipped with a reflux condenser, 40 wt % of phenyltrimethoxysilane, 15 wt % of methyltrimethoxysilane, 20 wt % of tetraethoxysilane, and 20 wt % of pure water were added, and then, 5 wt % of propylene glycol monomethyl ether acetate (PGMEA) was added, followed by refluxing and stirring the mixture in the presence of 0.1 wt % of an oxalic acid catalyst for 7 hours, and then cooling. After that, the reaction product was diluted with PGMEA so that a solid content was 40 wt %. A siloxane polymer having a weight average molecular weight of about 5,000 to 10,000 Da was synthesized.

Synthetic Example 2: Synthesis of Siloxane Polymer (b)

To a reactor equipped with a reflux condenser, 20 wt % of phenyltrimethoxysilane, 30 wt % of methyltrimethoxysilane, 20 wt % of tetraethoxysilane, and 15 wt % of pure water were added, and then, 15 wt % of PGMEA was added, followed by refluxing and stirring the mixture in the presence of 0.1 wt % of an oxalic acid catalyst for 6 hours, and then cooling. After that, the reaction product was diluted with PGMEA so that a solid content was 30 wt %. A siloxane polymer having a weight average molecular weight of about 8,000 to 13,000 Da was synthesized.

Synthetic Example 3: Synthesis of Siloxane Polymer (c)

To a reactor equipped with a reflux condenser, 20 wt % of phenyltrimethoxysilane, 30 wt % of methyltrimethoxysilane, 20 wt % of tetraethoxysilane, and 15 wt % of pure water were added, and then, 15 wt % of PGMEA was added, followed by refluxing and stirring the mixture in the presence of 0.1 wt % of an oxalic acid catalyst for 5 hours, and then cooling. After that, the reaction product was diluted with PGMEA so that a solid content was 30 wt %. A siloxane polymer having a weight average molecular weight of about 9,000 to 15,000 Da was synthesized.

Synthetic Example 4: Synthesis of Siloxane Polymer (d) Containing Fluorine

To a reactor equipped with a reflux condenser, 30 wt % of phenyltrimethoxysilane, 15 wt % of methyltrimethoxysilane, 20 wt % of tetraethoxysilane, 10 wt % of trifluoropropyltrimethoxysilane, and 20 wt % of pure water were added, and then, 5 wt % of PGMEA was added, followed by refluxing and stirring the mixture in the presence of 0.1 wt % of an oxalic acid catalyst for 7 hours, and then cooling. After that, the reaction product was diluted with PGMEA so that a solid content was 40 wt %. A siloxane polymer containing fluorine having a weight average molecular weight of about 5,000 to 10,000 Da was synthesized.

Synthetic Example 5: Synthesis of Epoxy Compound

A three-necked flask equipped with a condenser was placed on a stirrer with an automatic temperature controller. 100 parts by weight of a monomer consisting of glycidyl methacrylate (100 mole %), 10 parts by weight of 2,2'-azobis(2-methylbutyronitrile), and 100 parts by weight of PGMEA were put in the flask, and the flask was charged with nitrogen. The flask was heated to 80° C. while stirring the mixture slowly, and the temperature was maintained for 5 hours to obtain an epoxy compound having a weight average molecular weight of about 6,000 to 10,000 Da. Then, PGMEA was added thereto to adjust the solid content thereof to be 20 wt %.

Examples and Comparative Examples: Preparation of Photosensitive Resin Compositions Photosensitive resin compositions of the following examples and comparative examples were prepared using the compounds obtained in the above synthetic examples.

Besides, the following compounds were used in the examples and comparative examples:
- 1,2-quinonediazide compound: MIPHOTO TPA-517, Miwon Commercial Co., Ltd.
- solvent: PGMEA, Chemtronics Co., Ltd.
- gamma-butyrolactone (GBL), BASF
- surfactant: silicon surfactant, FZ-2122, Dow Corning Toray Co., Ltd.
  : fluorine surfactant, TF-1831, DIC
  : fluorine surfactant, RS-932, DIC
  : fluorine surfactant, TF-1807, DIC

Example 1

25.9 parts by weight of a solution of the siloxane polymer (a) of Synthetic Example 1, 34.4 parts by weight of a solution of the siloxane polymer (b) of Synthetic Example 2, 34.2 parts by weight of a solution of the siloxane polymer (c) of Synthetic Example 3, and 5.5 parts by weight of a solution of the siloxane polymer (d) of Synthetic Example 4 were mixed, and then, 5.5 parts by weight of TPA-517 as a 1,2-quinonediazide compound, 22.1 parts by weight of the epoxy compound of Synthetic Example 5, and 1.1 parts by weight of FZ-2122 as a surfactant based on 100 parts by weight of the total siloxane polymers were uniformly mixed. The mixture was dissolved in a mixture of PGMEA and GBL (PGMEA:GBL=88:12 by weight) so that a solid content was 17%. The mixture was stirred for 1 hour and 30 minutes and filtered using a membrane filter having 0.2 μm pores to obtain a composition having a solid content of 17 wt %.

Example 2

A composition having a solid content of 17 wt % was obtained by conducting the same procedure described in Example 1 except for using 24.2 parts by weight of a solution of the siloxane polymer (a) of Synthetic Example 1, 32.1 parts by weight of a solution of the siloxane polymer (b) of Synthetic Example 2, 32.6 parts by weight of a solution of the siloxane polymer (c) of Synthetic Example 3, and 11.1 parts by weight of a solution of the siloxane polymer (d) of Synthetic Example 4 as the siloxane polymers, and using 21.3 parts by weight of the epoxy compound of Synthetic Example 5.

Example 3

A composition having a solid content of 17 wt % was obtained by conducting the same procedure described in Example 1 except for using 22.6 parts by weight of a solution of the siloxane polymer (a) of Synthetic Example 1, 30.0 parts by weight of a solution of the siloxane polymer (b) of Synthetic Example 2, 30.8 parts by weight of a solution of the siloxane polymer (c) of Synthetic Example 3, and 16.6 parts by weight of a solution of the siloxane polymer (d) of Synthetic Example 4 as the siloxane polymers, and using 19.8 parts by weight of the epoxy compound of Synthetic Example 5.

Example 4

A composition having a solid content of 17 wt % was obtained by conducting the same procedure described in Example 1 except for using 20.6 parts by weight of a solution of the siloxane polymer (a) of Synthetic Example 1, 27.4 parts by weight of a solution of the siloxane polymer (b) of Synthetic Example 2, 29.8 parts by weight of a solution of the siloxane polymer (c) of Synthetic Example 3, and 22.3 parts by weight of a solution of the siloxane polymer (d) of Synthetic Example 4 as the siloxane polymers, and using 19.3 parts by weight of the epoxy compound of Synthetic Example 5.

Comparative Example 1

A composition having a solid content of 17 wt % was obtained by conducting the same procedure described in Example 1 except for using 27.4 parts by weight of a solution of the siloxane polymer (a) of Synthetic Example 1, 36.3 parts by weight of a solution of the siloxane polymer (b) of Synthetic Example 2, and 36.3 parts by weight of a solution of the siloxane polymer (c) of Synthetic Example 3 as the siloxane polymers, and using 23.6 parts by weight of the epoxy compound of Synthetic Example 5.

Comparative Example 2

A composition having a solid content of 17 wt % was obtained by conducting the same procedure described in Comparative Example 1 except for using 5.6 parts by weight of TPA-517 as the 1,2-quinonediazide compound, and 0.5 parts by weight of TF-1831 and 1.1 parts by weight of FZ-2122 as the surfactants.

Comparative Example 3

A composition having a solid content of 17 wt % was obtained by conducting the same procedure described in Comparative Example 1 except for using 5.6 parts by weight of TPA-517 as the 1,2-quinonediazide compound, and 0.5 part by weight of RS-932 and 1.1 parts by weight of FZ-2122 as the surfactants.

Comparative Example 4

A composition having a solid content of 17 wt % was obtained by conducting the same procedure described in Comparative Example 1 except for using 5.6 parts by weight of TPA-517 as the 1,2-quinonediazide compound, and 0.5 part by weight of TF-1807 and 1.1 parts by weight of FZ-2122 as the surfactants.

Experimental Example 1: Evaluation of Resolution (Sensitivity)

Each of the compositions obtained in the examples and comparative examples was coated on a silicon nitride substrate by spin coating, and the coated substrate was pre-baked on a hot plate kept at 110° C. for 90 seconds to form a dried film. The dried film was exposed to light, through a mask having a pattern consisting of square holes in sizes ranging from 2 μm to 25 μm, at an exposure rate of 0 to 200 mJ/cm$^2$ based on a wavelength of 365 nm for a certain period using an aligner (model name: MA6), which emits light having a wavelength of 200 nm to 450 nm, and was developed by spraying an aqueous developer of 2.38 wt % tetramethylammonium hydroxide through nozzles at 23° C. The exposed film was then heated in a convection oven at 230° C. for 30 minutes to obtain a cured film having a thickness of 3.0 μm.

For the hole pattern formed through a mask having a square hole pattern in a size of 10 μm, the amount of exposure energy required for attaining a critical dimension (CD, line width, μm) of 10 μm was measured. The lower the exposure energy is, the better the resolution (sensitivity) of a cured film is.

Experimental Example 2: Evaluation of Developability (Presence of Scum Upon Development)

Each of the compositions obtained in the examples and comparative examples was coated onto a silicon nitride substrate by spin coating, and the coated substrate was pre-baked on a hot plate kept at 110° C. for 90 seconds to form a dried film having a thickness of 2.1 μm. The dried film was exposed to light through a pattern mask at an exposure energy of about 100 mJ/cm$^2$ based on a wavelength of 365 nm for a certain time period using an aligner (model name: MA6), which emits light having a wavelength of 200 nm to 450 nm, and was developed by spraying an aqueous developer of 2.38 wt % tetramethylammonium hydroxide, through nozzles at 23° C. The film thus developed was then heated in a convection oven at 230° C. for 30 minutes to obtain a cured film having a thickness of 2 μm.

The developability was evaluated by observing the pattern profile formed in the cured film. Specifically, the pattern profile was evaluated under the following standards by observing the pattern profile thus formed with contact holes having a line width of 10 μm in the cured film with a scanning electron microscope:

⊚: The shape of rectangle was clear, and no bottom tail was observed.

○: The shape of rectangle was clear, but the surface was not smooth.

Δ: The shape of rectangle was clear, but the surface was not smooth or a spotted residual film was left.

X: The shape of rectangle was not clear, or the cured film was not developed.

Experimental Example 3: Measurement of Film Retention Rate

The same procedures as in Experimental Example 2 including pre-baking, exposure to light through a mask, development, and thermal curing were repeated for each of the compositions obtained in the examples and comparative examples to prepare a cured film. The film retention rate was obtained by calculating the percentage of the thickness of the final cured film relative to the thickness of the cured film right after the pre-baking process using a non-contact type thickness measuring device (SNU Precision).

Experimental Example 4: Evaluation of Light Transmittance

Each of the compositions obtained in the examples and comparative examples was coated onto a glass substrate by spin coating. The same procedure described in Experimental Example 2 including pre-baking, exposure to light through a mask, development, and thermal curing were repeated to prepare a cured film having a thickness of about 2 μm. The light transmittance of the cured film in a wavelength ranging from 400 to 800 nm was measured using an ultraviolet ray/visible ray spectrophotometer.

Experimental Example 5: Measurement of Fluorine Ion Intensity

A cured film was obtained via pre-baking, exposure to light through a mask, development and thermal curing using each of the compositions obtained in the examples and comparative examples according to the same procedure described in Experimental Example 2. The fluorine ion intensity of the cured film was measured by SIMS ion analysis. The fluorine content which penetrate the surface of the cured film to a thickness of about 3,000 Å was measured using a SIMS analyzer (TOF SIMS5, manufactured by ION TOF Co., Ltd.). In this case, the fluorine ion intensity of 1,000 or more may be evaluated to be good degree for imparting water-repellency.

Experimental Example 6: Evaluation of Chemical Resistance

A cured film was obtained via pre-baking, exposure to light through a mask, development and thermal curing using each of the compositions obtained in the examples and comparative examples according to the same procedure described in Experimental Example 2. The surface of the cured film was etched by about 3,000 Å via dry etching using $O_2$/SF6 gas (partial pressure ratio of 2.7:1) for 100 seconds using ICP (source). The thickness (T1) of the cured film after the dry etching was measured using a non-contact type thickness measuring device (SNU Precision). A rework chemical (product name: LT-360) was introduced to a constant temperature bath and then the temperature was maintained at 50° C. The cured film was immersed in the bath for 5 minutes, and the rework chemical was removed by air. Then, the thickness (T2) of the cured film was measured.

The chemical resistance was evaluated from the measured values via the following Equation 1 (after evaluating chemical resistance, a swelling thickness was calculated). In this case, the swelling thickness after the evaluation experiment for the chemical resistance is less than 1,000 Å, it may be evaluated to have good chemical resistance.

Swelling thickness after evaluation experiment on chemical resistance (Å)=film thickness after immersing into rework chemical (T2)−film thickness before immersing into rework chemical (T1)[Equation 1]

Experimental Example 7: Measurement of Contact Angle

A cured film was obtained using each of the compositions obtained in the examples and comparative examples according to the same procedure described in Experimental Example 6, and a dry etching process was performed. The contact angle at the surface of the cured film with respect to ultrapure water was measured after the dry etching using a contact angle measuring device. Generally, the surface of the cured film may become non-uniform after it is etched via dry etching, and the contact angle is decreased when compared to that of the surface before the dry etching. In case where the contact angle after the dry etching is increased, it may be considered that a fluorine component is uniformly dispersed in the cured film, and good water-repellency is obtained. In case where the contact angle after the dry etching is 80° or more, surface water-repellency is good, swelling degree by chemicals is minimized, and chemical resistance can be evaluated as good.

Experimental results are summarized in the following Table 1.

TABLE 1

| | Sensitivity (mJ) | Developability | Retention rate (%) | F ion intensity (ion counts @ 100*100 um²) | Chemical Resistance (swelling thickness, Å) | Contact angle (deg °) | Light transmittance (%) |
|---|---|---|---|---|---|---|---|
| Example 1 | 42 | ⊚ | 94.4 | 4355 | 479 | 80.4 | 96.49 |
| Example 2 | 42 | ⊚ | 93.0 | 5947 | 489 | 80.6 | 96.66 |
| Example 3 | 38.5 | ⊚ | 93.2 | 7860 | 411 | 82.9 | 97.35 |
| Example 4 | 38.5 | ⊚ | 93.4 | 9950 | 682 | 84.1 | 97.25 |
| Comparative Example 1 | 42 | ⊚ | 93.1 | 0 | 481 | 69.2 | 96.49 |
| Comparative Example 2 | 42 | ⊚ | 92.5 | 820 | 1046 | 70.1 | 96.42 |
| Comparative Example 3 | 42 | ⊚ | 92.7 | 450 | 1255 | 70.5 | 96.45 |
| Comparative Example 4 | 42 | ⊚ | 92.4 | 390 | 1140 | 69.8 | 96.32 |

As shown in Table 1, the cured films formed from the compositions of the present invention exhibited good sensitivity, developability, retention rate, chemical resistance, and contact angle, and high light transmittance. In contrast, the compositions according to Comparative Examples 1 to 4, which are not included in the scope of the present invention, exhibited decreased contact angle due to low fluorine ion intensity.

What is claimed is:

1. A photosensitive resin composition, comprising:
   (A) a siloxane polymer containing a fluorine atom;
   (B) a 1,2-quinonediazide compound; and
   (C) an epoxy compound,
   wherein the siloxane polymer containing a fluorine atom (A) comprises at least one structural unit derived from a silane compound represented by the following formula 1:

$(R^1)_n Si(OR^2)_{4-n}$ [Formula 1]

in formula 1, $R^1$ is a fluorine atom or a monovalent hydrocarbon containing a fluorine atom, wherein, in case where $R^1$ is the monovalent hydrocarbon, hydrogen atoms may be partially or wholly substituted, and in case where a plurality of $R^1$ is present in the same molecule, each $R^1$ may be identical to or different from one another;
   $R^2$ is hydrogen, alkyl having 1 to 6 carbon atoms, acyl having 2 to 6 carbon atoms, or aryl having 6 to 15 carbon atoms, wherein, in case where a plurality of $R^2$ is present in the same molecule, each $R^2$ may be identical to or different from one another, and in case where $R^2$ is alkyl, acyl or aryl, hydrogen atoms may be partially or wholly substituted; and
   n is an integer from 1 to 3,
   wherein the siloxane polymer (A) containing a fluorine atom is included in an amount of 50 to 95 wt % based on the total weight of the solid content of the composition excluding solvents, and
   wherein the epoxy compound (C) is included in the photosensitive resin composition in an amount of 5 to 25 parts by weight based on 100 parts by weight of the siloxane polymer (A) on the basis of the solid content excluding solvents.

2. The photosensitive resin composition of claim 1, wherein the epoxy compound(C) does not include a carboxyl group.

3. The photosensitive resin composition of claim 1, wherein the siloxane polymer containing a fluorine atom(A) further comprises at least one structural unit derived from a silane compound represented by the following formula 2:

$(R^3)_n Si(OR^2)_{4-n}$ [Formula 1]

in formula 2, $R^3$ is alkyl having 1 to 12 carbon atoms, alkenyl having 2 to 10 carbon atoms or aryl having 6 to 15 carbon atoms, wherein, in case where a plurality of $R^3$ is present in the same molecule, each $R^3$ may be identical to or different from one another, in case where $R^3$ is alkyl, alkenyl or aryl, hydrogen atoms may be partially or wholly substituted, and $R^3$ may include a structural unit containing a heteroatom;

$R^4$ is hydrogen, alkyl having 1 to 6 carbon atoms, acyl having 2 to 6 carbon atoms, or aryl having 6 to 15 carbon atoms, wherein, in case where a plurality of $R^4$ is present in the same molecule, each $R^4$ may be identical to or different from one another, and in case where $R^4$ is alkyl, acyl or aryl, hydrogen atoms may be partially or wholly substituted; and n is an integer from 0 to 3.

4. The photosensitive resin composition of claim 3, wherein the siloxane polymer containing a fluorine atom(A) comprises a structural unit derived from a silane compound of formula 2 where n is 0.

5. The photosensitive resin composition of claim 1, wherein the siloxane polymer containing a fluorine atom(A) comprises the fluorine atom in an amount of 1 to 30% of the content(mole %) of the fluorine-containing structural unit in the siloxane polymer based on an Si atomic mole number.

6. A method of forming a pattern, comprising:
    forming a silicon-containing film on a surface of a substrate using a photosensitive resin composition, comprising (A) a siloxane polymer containing a fluorine atom, (B) a 1,2-quinonediazide compound and (C) an epoxy compound;
    patterning the silicon-containing film using light; and
    dry etching the patterned silicon-containing film and the substrate to form a pattern in the substrate,
    wherein the siloxane polymer containing a fluorine atom(A) comprises at least one structural unit derived from a silane compound represented by the following formula 1:

$(R^1)_n Si(OR^2)_{4-n}$ [Formula 1]

in formula 1, $R^1$ is a fluorine atom or a monovalent hydrocarbon containing a fluorine atom, wherein, in case where $R^1$ is the monovalent hydrocarbon, hydrogen atoms may be partially or wholly substituted, and in case where a plurality of $R^1$ is present in the same molecule, each $R^1$ may be identical to or different from one another;

$R^2$ is hydrogen, alkyl having 1 to 6 carbon atoms, acyl having 2 to 6 carbon atoms, or aryl having 6 to 15 carbon atoms, wherein, in case where a plurality of $R^2$ is present in the same molecule, each $R^2$ may be identical to or different from one another, and in case where $R^2$ is alkyl, acyl or aryl, hydrogen atoms may be partially or wholly substituted; and n is an integer from 1 to 3, wherein the siloxane polymer (A) containing a fluorine atom is included in an amount of 50 to 95 wt % based on the total weight of the solid content of the composition excluding solvents, and wherein the epoxy compound (C) is included in the photosensitive resin composition in an amount of 5 to 25 parts by weight based on 100 parts by weight of the siloxane polymer (A) on the basis of the solid content excluding solvents.

7. A silicon-containing cured film formed by a method of forming a pattern, comprising:
    forming a silicon-containing film on a surface of a substrate using a photosensitive resin composition, comprising (A) a siloxane polymer containing a fluorine atom, (B) a 1,2-quinonediazide compound and (C) an epoxy compound;
    patterning the silicon-containing film using light; and
    dry etching the patterned silicon-containing film and the substrate to form a pattern in the substrate,
    wherein the siloxane polymer containing a fluorine atom(A) comprises at least one structural unit derived from a silane compound represented by the following formula 1:

$(R^1)_n Si(OR^2)_{4-n}$ [Formula 1]

in formula 1, $R^1$ is a fluorine atom or a monovalent hydrocarbon containing a fluorine atom, wherein, in case where $R^1$ is the monovalent hydrocarbon, hydrogen atoms may be partially or wholly substituted, and in case where a plurality of $R^1$ is present in the same molecule, each $R^1$ may be identical to or different from one another;

$R^2$ is hydrogen, alkyl having 1 to 6 carbon atoms, acyl having 2 to 6 carbon atoms, or aryl having 6 to 15 carbon atoms, wherein, in case where a plurality of $R^2$ is present in the same molecule, each $R^2$ may be identical to or different from one another, and in case where $R^2$ is alkyl, acyl or aryl, hydrogen atoms may be partially or wholly substituted; and n is an integer from 1 to 3, wherein the siloxane polymer (A) containing a fluorine atom is included in an amount of 50 to 95 wt % based on the total weight of the solid content of the composition excluding solvents, and wherein the epoxy compound (C) is included in the photosensitive resin composition in an amount of 5 to 25 parts by weight based on 100 parts by weight of the siloxane polymer (A) on the basis of the solid content excluding solvents.

8. The silicon-containing cured film of claim 7, wherein the silicon-containing cured film has a contact angle of 80° or more after dry etching.

* * * * *

UNITED STATES PATENT AND TRADEMARK OFFICE
CERTIFICATE OF CORRECTION

PATENT NO. : 10,890,846 B2
APPLICATION NO. : 15/769945
DATED : January 12, 2021
INVENTOR(S) : Jong-Ho Na et al.

Page 1 of 1

It is certified that error appears in the above-identified patent and that said Letters Patent is hereby corrected as shown below:

Claim 3, Column 18, Lines 66-67 should read:
$(R^3)_n Si(OR^4)_{4-n}$     [Formula 2]

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*